(12) United States Patent
Ran et al.

(10) Patent No.: US 9,602,401 B2
(45) Date of Patent: Mar. 21, 2017

(54) TECHNOLOGIES FOR HIGH-SPEED PCS SUPPORTING FEC BLOCK SYNCHRONIZATION WITH ALIGNMENT MARKERS

(71) Applicant: Intel Corporation, Santa Clara, CA (US)

(72) Inventors: Adee O. Ran, Maayan Baruch (IL); Kent C. Lusted, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 14/580,737

(22) Filed: Dec. 23, 2014

(65) Prior Publication Data

US 2016/0087753 A1 Mar. 24, 2016

Related U.S. Application Data

(60) Provisional application No. 62/053,656, filed on Sep. 22, 2014.

(51) Int. Cl.
| | | |
|---|---|---|
| *H03M 13/03* | (2006.01) | |
| *H04L 12/721* | (2013.01) | |
| *H04L 1/00* | (2006.01) | |
| *H03M 13/25* | (2006.01) | |

(52) U.S. Cl.
CPC ............ *H04L 45/66* (2013.01); *H03M 13/25* (2013.01); *H04L 1/0041* (2013.01); *H04L 1/0057* (2013.01); *H03M 13/251* (2013.01); *H04L 1/0083* (2013.01)

(58) Field of Classification Search
CPC ....... H04L 45/66; H04L 49/351; H04L 12/28; H04L 1/0618; H04L 1/0041; H04L 1/0057; H03M 13/03; H03M 13/05; H03M 13/251; H03M 13/25
See application file for complete search history.

(56) References Cited

U.S. PATENT DOCUMENTS

2014/0064088 A1* 3/2014 Ghiasi ..................... H04L 49/60
370/235

OTHER PUBLICATIONS

Toyoda et al., 100GbE PHY and MAC Layer implementations, 2010, IEEE Communications Magazine, pp. S41-S47.*
(Continued)

*Primary Examiner* — Shelly A Chase
(74) *Attorney, Agent, or Firm* — Barnes & Thornburg LLP

(57) ABSTRACT

Technologies for high-speed data transmission include a network port logic having one or more communication lanes coupled to a forward error correction (FEC) sublayer and a physical coding sublayer (PCS). To transmit data, the PCS encodes the data to be transmitted into encoded data blocks using a 66 b/64 b line code and inserts alignment marker blocks after every 16,383 encoded data blocks. The FEC encodes the encoded data blocks into 80-block FEC codewords starting at a predefined offset from an alignment marker. Thus, each alignment marker is at one of five predefined offsets from the beginning of an FEC codeword. Each alignment marker may include a unique block type field usable with FEC encoding. The PCS may include one or more logical lanes, each operating at 25 Gb/s. Embodiments of the network port logic may include a single PCS lane or sixteen PCS lanes. Other embodiments are described and claimed.

19 Claims, 5 Drawing Sheets

(56) References Cited

OTHER PUBLICATIONS

Liu et al., Enhanced equalization and Forward Error Correction Coding technologies for 25+Gb/s serial link system, 2012, DesignCon (retrieved from google .com May 24, 2016).*
Chen et al., A novel network coded parallel transmission framework for high speed Ethernet, 2013, IEEE, pp. 2382-2387.*

* cited by examiner

TECHNOLOGIES FOR HIGH-SPEED PCS SUPPORTING FEC BLOCK SYNCHRONIZATION WITH ALIGNMENT MARKERS

CROSS-REFERENCE TO RELATED APPLICATION

The present application claims priority under 35 U.S.C. §119(e) to U.S. Provisional Patent Application Ser. No. 62/053,656, entitled "HIGH-SPEED PCS SUPPORTING FEC BLOCK SYNCHRONIZATION WITH ALIGNMENT MARKERS," which was filed on Sep. 22, 2014.

BACKGROUND

Several Ethernet physical layers defined during recent years use a common physical coding sublayer (PCS) structure defined in clause 82 of the IEEE standard 802.3 (2012). This PCS is modular and enables multiple data rates. In the clause 82 PCS, the incoming data is divided into logical PCS lanes (PCSLs), each carrying 5 Gb/s or 10 Gb/s. Each PCS lane is encoded separately. Data from several PCS lanes may be multiplexed and transmitted over a higher-speed physical communication lane. The clause 82 PCS was designed to support both 40 Gb/s and 100 Gb/s Ethernet, with 100 G implemented as either 10×10 G physical lanes or 4×25 G physical lanes.

Due to possible mismatch between delays in different physical lanes, bits transmitted at the same time over multiple physical lanes may arrive at the receiver in different times. In addition, the Ethernet standard allows re-ordering of physical lanes to allow flexibility in routing. To enable reconstructing the original data sequence, alignment markers (AMs) are inserted in each logical PCS lane periodically. Each AM is a predefined block of data that is different for each lane, so AMs may be used to identify the received lanes and enable de-skewing and re-alignment of the physical lanes. The AMs specified by clause 82 of the Ethernet standard do not support more than 20 logical PCS lanes, and thus may not support scaling to 400 Gb/s Ethernet (e.g., scaling to 40×10 Gb/s PCS lanes or 80×5 Gb/s PCS lanes). Similarly, the forward error correction code defined by clause 91 of the IEEE standard 802.3bj-2014 (RS-FEC) assumes 20 logical PCS lanes and does not support a different number of PCS lanes.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
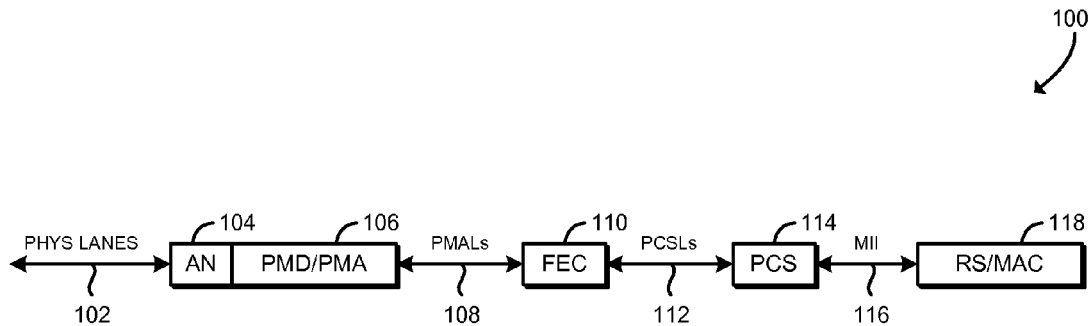
FIG. 1 is a simplified block diagram of at least one embodiment of Ethernet port logic for fast PCS FEC block sync.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one of A, B, and C" can mean (A); (B); (C): (A and B); (A and C); (B and C); or (A, B, and C). Similarly, items listed in the form of "at least one of A, B, or C" can mean (A); (B); (C): (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, in an illustrative embodiment, an Ethernet port logic 100 is capable of communication over one or more physical communication lanes 102. The Ethernet port logic 100 may include a physical coding sublayer (PCS) capable of operating at 25 gigabits per second (Gb/s) per logical PCS lane. The Ethernet port logic 100 may also include forward error correction (FEC) logic that generates FEC codewords that are aligned by a predefined offset with alignment markers included on each logical PCS lane. Thus, the FEC logic may generate FEC codewords without performing complicated alignment marker removal and re-insertion. The Ethernet port logic 100 of this disclosure may support scaling to high Ethernet bit rates (e.g., 50 Gb/s with 2 PCS lanes, 400 Gb/s with 16 PCS lanes, or 25 Gb/s with a single PCS lane). The alignment marker scheme used by the Ethernet port logic 100 is compatible with RS-FEC encoding and may allow for fast synchronization of 25 Gb/s RS-FEC. Additionally, although illustrated as an Ethernet port logic 100, it should be understood that the Ethernet port logic 100 may be embodied as any network port logic implementing a different network architecture that is capable of implementing the functions described herein.

The illustrative Ethernet port logic 100 includes an auto-negotiation module 104, a physical medium dependent (PMD) sublayer/physical medium attachment (PMA) sublayer 106, a forward error correction (FEC) sublayer module 110, a physical coding sublayer (PCS) module 114, and a reconciliation sublayer/media access control sublayer (MAC) module 118. Additionally, in some embodiments, one or more of the illustrative components may be incorporated in, or otherwise form a portion of, another component. For example, part or all of the auto-negotiation module 104, the PMD/PMA 106, and/or the FEC 110 may be incorporated in the PCS 114.

The communication lanes 102 may be embodied as any one or more computer communication links. For example, each communication lane 102 may be embodied as a twisted pair conductor, an optical fiber, or an electrical backplane connection. In some embodiments, each communication lane 102 may be capable of full-duplex operation. For example, each communication lane 102 may include two pairs of electrical conductors, one pair for transmitting data and the other pair for receiving data. Illustratively, the communication lanes 102 may include four communication lanes 102 operating at 100 Gb/s each or eight communication lanes 102 operating at 50 Gb/s each (for 400 Gb/s total bandwidth). As another example, the communication lanes 102 may include a single communication lane 102 operating at 25 Gb/s. As a further example, the communication lanes 102 may include five communication lanes 102 operating at 100 Gb/s each or 10 communication lanes 102 operating at 50 Gb/s each (for 500 Gb/s total bandwidth). Although described as operating at a data rate such as 25 Gb/s, it should be understood that in some embodiments the communications lanes 102 may operate at a slightly higher signaling rate such as 25.78125 Gb/s, to allow for additional data for line encoding, error correction, and other additional data.

The MAC 118 is configured to transmit Ethernet frame data to the PCS 114 to be encoded and transmitted, and to receive data from the PCS 114 produce Ethernet frame data. The MAC 118 communicates with the PCS 114 via a media-independent interface 116. For example, the MAC 118 may communicate via a media-independent interface similar to the 40 gigabit media independent interface (XLG-MII), a 100 gigabit media independent interface (CGMII), or any appropriate interface. The MAC 118 may perform Ethernet frame detection and validation, packet reception and transmission, cyclic redundancy check (CRC) validation, CRC computation, and other media access control sublayer operations.

The PCS 114 is configured to encode Ethernet frame data received from the MAC 118 into encoded data blocks that may be transmitted by the PMD/PMA 106, and to decode data received from the PMD/PMA 106 into decoded Ethernet frame data that may be processed by the MAC 118. The PCS 114 may encode and distribute the data blocks over one or more logical PCS lanes (PCSLs) 112. Each PCS lane 112 may operate at 25 Gb/s, or may operate at a higher speed, such as 50 Gb/s. The PCS 114 may encode data for transmission over the communication lanes 102 to improve communication efficiency. For example, encoding the data may add timing or synchronization symbols, align the data, add state transitions to the encoded data to improve clock recovery, adjust the DC balance of the data signal, or otherwise prepare the encoded data for serial transmission. The PCS 114 may be capable of encoding or decoding the data using a 64 b/66 b line code in which 64-bit blocks of data are encoded into 66-bit blocks of encoded data, and vice versa.

The PCS 114 is further configured to regularly insert alignment markers into the encoded data stream on each PCS lane 112. For example, the PCS 114 may insert an alignment marker after every 16,383 encoded blocks transmitted on each PCS lane 112. The alignment markers may be embodied as predetermined 66-bit data blocks, and each PCS lane 112 may be associated with a unique, predetermined alignment marker. In some embodiments, the alignment markers may include a unique block type field; that is, a block type field that is not used by other control blocks. The unique block type field may be embodied as, for example, an octet equal to 0x33.

The FEC 110 is configured to apply a forward error correction code to the data passed over the PCS lanes 112 between the PMD/PMA 106 and the PCS 114. In other words, the FEC 110 may encode data passed from the PCS 114 to the PMD/PMA 106 and decode data passed from the PMD/PMA 106 to the PCS 114. The FEC 110 may generate 80-block FEC codewords that start at a predefined block offset from the alignment markers inserted by the PCS 114, without removing or re-inserting the alignment markers. Additionally or alternatively, the FEC 110 may remove alignment markers from PCS lanes 112 and then reinsert the alignment markers following the next 80-block FEC codeword. The forward error correction code may improve the reliability of data transmission at higher line speeds. In the illustrative embodiment, the FEC 110 applies a Reed-Solomon forward error correction code (RS-FEC). In other embodiments, the FEC 110 may apply any appropriate forward error correction code. The FEC 110 may communicate with the PMD/PMA 106 over one or more PMA lanes 108. In some embodiments, the PMA lanes 108 may each be equivalent to a PCS lane 112; that is, the Ethernet port logic 100 may include the same number of PMA lanes 108 and PCS lanes 112, and each PMA lane 108 may operate at the same speed as the PCS lanes 112. Of course, in some embodiments the Ethernet port logic 100 may include different numbers of PMA lanes 108 and PCS lanes 112. In some embodiments, the Ethernet port logic 100 may not include an FEC 110 and/or the FEC 110 may be optional. In embodiments that do not include the FEC 110, the PCS 114 may be coupled directly to the PMD/PMA 106.

The PMD/PMA 106 is configured to transmit and receive serial binary data over the communication lanes 102. The PMD/PMA 106 may also multiplex data from multiple PCS lanes 112 and/or PMA lanes 108 onto a single communication lane 102, and demultiplex data from each communication lane 102 onto multiple PCS lanes 112. For example, the PMD/PMA 106 may multiplex four PCS lanes 112 at 25 Gb/s each onto a single communication lane 102 at 100 Gb/s or two PCS lanes 112 at 25 Gb/s each onto a single communication lane 102 at 50 Gb/s. In some embodiments, the PMD/PMA 106 may transmit and receive data for a single PCS lane 112 via a single communication lane 102, without performing any multiplexing.

The auto-negotiation module 104 is configured to auto-negotiate line transmission speed, mode of operation, and other communication parameters with a link partner when the communication lane 102 is brought up. The auto-negotiation module 104 may be embodied as a state machine or other logic capable of implementing an auto-negotiation protocol. For example, the auto-negotiation module 104 may implement the auto-negotiation protocol specified by clause 73 of the IEEE 802.3 specification, clause 37 of the IEEE 802.3 specification, or the serial gigabit media independent interface (SGMII) auto-negotiation protocol. Although illustrated in FIG. 1 as coupled between the PMD/PMA 106 and the communication lanes 102, in other embodiments the auto-negotiation module 104 may be included at different positions in the Ethernet port logic 100. For example, in some embodiments the auto-negotiation module 104 may be coupled between the PMD/PMA 106 and the FEC 110.

Figure 2:
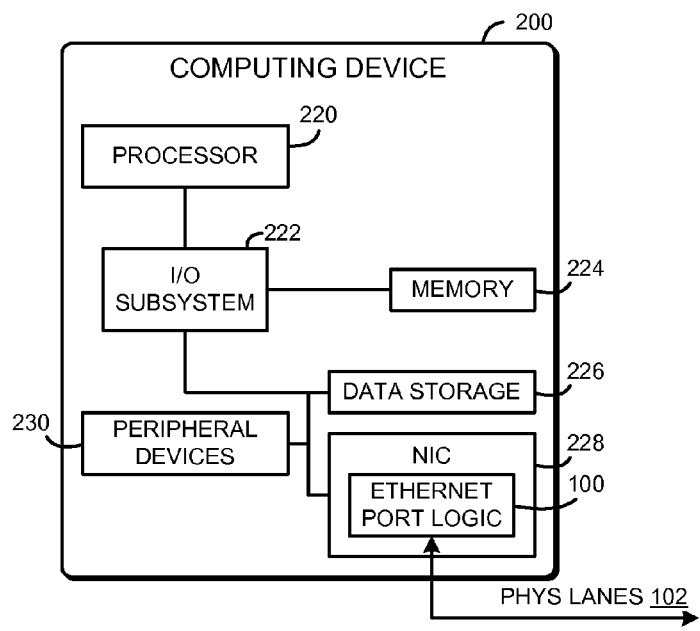
FIG. 2 is a simplified block diagram of at least one embodiment of a computing device that may include the Ethernet port logic of FIG. 1.

Referring now to FIG. 2, in an illustrative embodiment, a computing device 200 may include the Ethernet port logic 100. The computing device 200 may be embodied as any type of computation or computer device capable of performing the functions described herein, including, without limitation, a computer, a smartphone, a tablet computer, a laptop computer, a notebook computer, a mobile computing device, a wearable computing device, a multiprocessor system, a server, a rack-mounted server, a blade server, a network switch, a network appliance, a web appliance, a distributed computing system, a processor-based system, and/or a consumer electronic device. As shown in FIG. 1, the computing device 200 illustratively includes a processor 220, an input/output subsystem 222, a memory 224, a data storage device 226, and a network interface circuit or card (NIC) 228. Of course, the computing device 200 may include other or additional components, such as those commonly found in a computer (e.g., various input/output devices), in other embodiments. Additionally, in some embodiments, one or more of the illustrative components may be incorporated in, or otherwise form a portion of, another component. For example, the memory 224, or portions thereof, may be incorporated in the processor 220 in some embodiments.

The processor 220 may be embodied as any type of processor capable of performing the functions described herein. For example, the processor 220 may be embodied as a single or multi-core processor(s), digital signal processor, microcontroller, or other processor or processing/controlling circuit. Similarly, the memory 224 may be embodied as any type of volatile or non-volatile memory or data storage capable of performing the functions described herein. In operation, the memory 224 may store various data and software used during operation of the computing device 200 such as operating systems, applications, programs, libraries, and drivers. The memory 224 is communicatively coupled to the processor 220 via the I/O subsystem 222, which may be embodied as circuitry and/or components to facilitate input/output operations with the processor 220, the memory 224, and other components of the computing device 200. For example, the I/O subsystem 222 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 222 may form a portion of a system-on-a-chip (SoC) and be incorporated, along with the processor 220, the memory 224, and other components of the computing device 200, on a single integrated circuit chip. The data storage device 226 may be embodied as any type of device or devices configured for short-term or long-term storage of data such as, for example, memory devices and circuits, memory cards, hard disk drives, solid-state drives, or other data storage devices.

The NIC 228 may connect the computing device 200 to one or more computing devices, network devices, switches, remote hosts, or other devices. The NIC 228 may be embodied as one or more add-in-boards, daughtercards, controller chips, chipsets, or other devices that may be used by the computing device 200 for network communications with remote devices. For example, the NIC 228 may be embodied as an expansion card coupled to the I/O subsystem 222 over an expansion bus such as PCI Express. In the illustrative embodiment, the NIC 228 includes a single Ethernet port logic 100 to connect to the remote devices. Of course, in other embodiments the computing device 200 may include additional or fewer Ethernet port logics 100 to support a different number of communication lanes 102.

In some embodiments, the computing device 200 may also include one or more peripheral devices 230. The peripheral devices 230 may include any number of additional input/output devices, interface devices, and/or other peripheral devices. For example, in some embodiments, the peripheral devices 230 may include a display, touch screen, graphics circuitry, keyboard, mouse, speaker system, network interface, and/or other input/output devices, interface devices, and/or peripheral devices.

Figure 3:
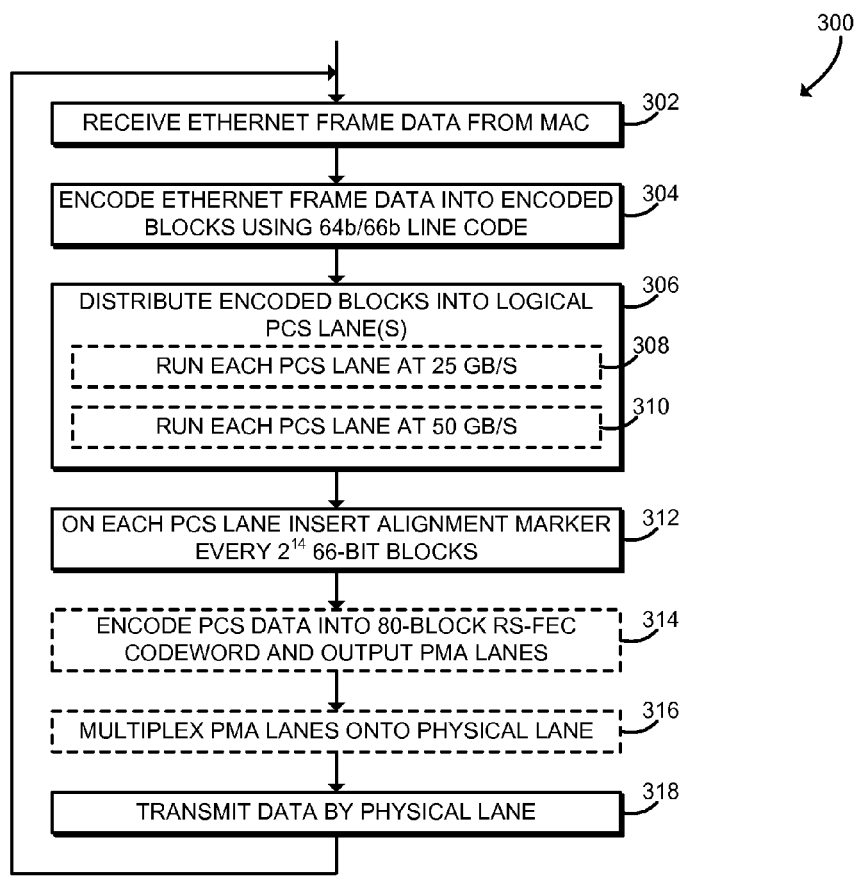
FIG. 3 is a simplified flow diagram of at least one embodiment of a method for transmitting data that may be executed by the Ethernet port logic of FIG. 1.

Referring now to FIG. 3, in use, the Ethernet port logic 100 may execute a method 300 for data transmission. The method 300 begins in block 302, in which the Ethernet port logic 100 receives Ethernet frame data for transmission from the MAC 118 using the PCS 114. The MAC 118 provides data for transmission at the Ethernet data rate (for example, 400 Gb/s, 500 Gb/s, or 25 Gb/s). The PCS 114 may receive the data for transmission via the media-independent interface 116.

In block 304, the Ethernet port logic 100 encodes the data received from the MAC 118 to encoded data blocks using the PCS 114. As described above, the data blocks may be encoded to improve transmission efficiency over the physical communication lanes 102. The PCS 114 applies a 64 b/66 b line code to generate 66-bit encoded data block for each 64-bit block of data. In some embodiments, the PCS 114 may apply the single-lane 64 b/66 b line code described in clause 49 of the IEEE standard 802.3; that is, the 64 b/66 b line code used by 10 GBASE-R. In other embodiments, the PCS 114 may apply the multi-lane 64 b/66 b line code described in clause 82 of the IEEE standard 802.3. The 66-bit encoded blocks may include a two-bit synchronization symbol and up to 64 bits of scrambled data as a payload.

In block 306, the Ethernet port logic 100 distributes the encoded 66-bit blocks onto one or more logical PCS lanes 112 using the PCS 114. The PCS 114 may distribute the encoded blocks in a round-robin order. The PCS 114 may operate each of the PCS lanes 112 at a data rate faster than the PCS lanes described in clause 82 of the IEEE standard 802.3, that is, faster than 10 Gb/s or 5 Gb/s. It should be understood that the signaling rate of each communication lane 102 may be an integer multiple of the PCS lane 112 bit rate. In some embodiments, in block 308, the Ethernet port logic 100 may operate each PCS lane 112 at 25 GB/s. At 25 Gb/s per PCS lane 112, the Ethernet port logic 100 may include up to 20 distinct PCS lanes 112 (providing up to 500 Gb/s total bandwidth) and may also support 25 Gb/s Ethernet (using a single PCS lane 112) or 400 Gb/s Ethernet (using 16 PCS lanes 112, optionally multiplexed to eight or four physical communication lanes 102). In some embodiments, in block 310, the Ethernet port logic 100 may operate each PCS lane 112 at 50 GB/s. At 50 Gb/s per PCS lane 112 or faster, the Ethernet port logic 100 may support 50 Gb/s Ethernet or terabit Ethernet and beyond without requiring a new alignment marker definition.

In block 312, for each PCS lane 112, the Ethernet port logic 100 inserts an alignment marker (AM) at every $2^{14th}$ encoded 66-bit block using the PCS 114. That is, the PCS 114 may output 16,383 encoded 66-bit blocks, output a single 66-bit alignment marker, output the next 16,383 encoded 66-bit blocks, and so on. Each alignment marker may be embodied as a predefined 66-bit block that may be used to synchronize the PCS lane 112 data and identify the PCS lane 112 lane number. For example, in some embodiments, the AM encoding may be the AM encoding described in clause 82 of the IEEE standard 802.3 or the rapid alignment marker (RAM) encoding described in IEEE standard 802.3bj-2014. The Ethernet port logic 100 may make room for the inserted AMs by occasionally removing idle blocks as necessary. Although illustrated as inserting an AM at every $2^{14th}$ encoded 66-bit block, it should be understood that in some embodiments, the Ethernet port logic 100 may insert an AM after a different interval. In some embodiments, if the number of PCS lanes 112 is not a multiple of five, the Ethernet port logic 100 may use a number of blocks for the interval that is a multiple of five to maintain alignment between 80-block-long RS-FEC codewords and inserted AMs. For example, for a single PCS lane 112 at 25 Gb/s, the Ethernet port logic 100 may insert an AM at every $5 \cdot 2^{12th}$ encoded 66-bit blocks.

Figure 4:
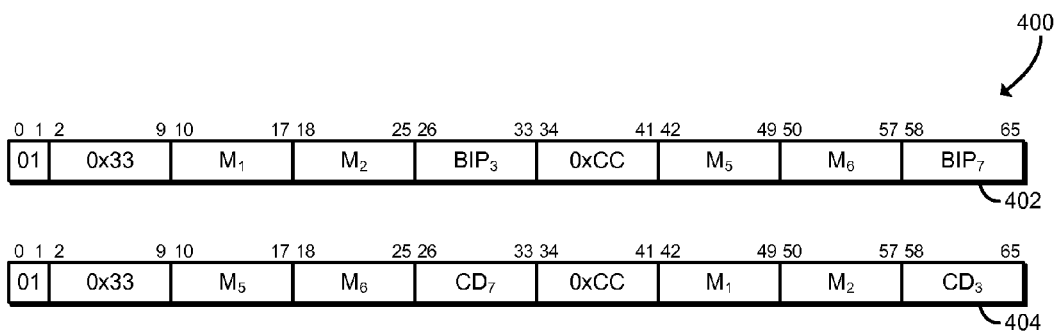
FIG. 4 is a schematic diagram of potential embodiments of alignment markers that may be used by the Ethernet port logic of FIG. 1.

In some embodiments, the AM encoding used may be similar to but not identical with the AM encoding described in clause 82 of the IEEE standard 802.3 or the RAM encoding described in IEEE standard 802.3bj-2014. Referring now to FIG. 4, the schematic diagram 400 illustrates potential embodiments of an alignment marker 402 and a rapid alignment marker 404. As shown, the PCS 114 may perform AM encoding by defining a new block type for alignment markers (for example, one of the five unused block types listed in comment 6 of clause 82.2.3.3 of the IEEE standard 802.3, and in the illustrative embodiment 0x33). All alignment markers (both normal AMs and RAMs) may include this block type as the first byte and the inverse code (e.g., 0xCC) as the fifth byte. Normal AMs may include predefined byte values M1, M2, M5 and M6 (as used by the existing AM encodings defined in table 82-2 of the IEEE standard 802.3) at the remaining locations, while RAMs may include them in the alternate order M5, M6, M1, M2. Illustrative AM encodings that may be used by the PCS 114 are illustrated below in Table 1.

TABLE 1

Alignment Marker encodings.

| PCS Lane No. | AM Encoding {0x33, $M_1$, $M_2$, $BIP_3$, 0xCC, $M_5$, $M_6$, $BIP_7$} |
|---|---|
| 0 | 0x33, 0x68, 0x21, $BIP_3$, 0xCC, 0x97, 0xDE, $BIP_7$ |
| 1 | 0x33, 0x71, 0x8E, $BIP_3$, 0xCC, 0x8E, 0x71, $BIP_7$ |
| 2 | 0x33, 0x4B, 0xE8, $BIP_3$, 0xCC, 0xB4, 0x17, $BIP_7$ |
| 3 | 0x33, 0x95, 0x7B, $BIP_3$, 0xCC, 0x6A, 0x84, $BIP_7$ |
| 4 | 0x33, 0x07, 0x09, $BIP_3$, 0xCC, 0xF8, 0xF6, $BIP_7$ |
| 5 | 0x33, 0x14, 0xC2, $BIP_3$, 0xCC, 0xEB, 0x3D, $BIP_7$ |
| 6 | 0x33, 0x4A, 0x26, $BIP_3$, 0xCC, 0xB5, 0xD9, $BIP_7$ |
| 7 | 0x33, 0x45, 0x66, $BIP_3$, 0xCC, 0xBA, 0x99, $BIP_7$ |
| 8 | 0x33, 0x24, 0x76, $BIP_3$, 0xCC, 0xDB, 0x89, $BIP_7$ |
| 9 | 0x33, 0xC9, 0xFB, $BIP_3$, 0xCC, 0x36, 0x04, $BIP_7$ |
| 10 | 0x33, 0x6C, 0x99, $BIP_3$, 0xCC, 0x93, 0x66, $BIP_7$ |
| 11 | 0x33, 0x91, 0x55, $BIP_3$, 0xCC, 0x6E, 0xAA, $BIP_7$ |
| 12 | 0x33, 0xB9, 0xB2, $BIP_3$, 0xCC, 0x46, 0x4D, $BIP_7$ |
| 13 | 0x33, 0xF8, 0xBD, $BIP_3$, 0xCC, 0x07, 0x42, $BIP_7$ |
| 14 | 0x33, 0xC7, 0xCA, $BIP_3$, 0xCC, 0x38, 0x35, $BIP_7$ |
| 15 | 0x33, 0x36, 0xCD, $BIP_3$, 0xCC, 0xC9, 0x32, $BIP_7$ |
| 16 | 0x33, 0x31, 0x4C, $BIP_3$, 0xCC, 0xCE, 0xB3, $BIP_7$ |
| 17 | 0x33, 0xD6, 0xB7, $BIP_3$, 0xCC, 0x29, 0x48, $BIP_7$ |
| 18 | 0x33, 0x66, 0x2A, $BIP_3$, 0xCC, 0x99, 0xD5, $BIP_7$ |
| 19 | 0x33, 0xF0, 0xE5, $BIP_3$, 0xCC, 0x0F, 0x1A, $BIP_7$ |

In block 314, in some embodiments the Ethernet port logic 100, using the FEC 110, may encode data from the PCS lanes 112 into forward error correction (FEC) codewords and output the FEC codewords onto the PMA lanes 108. The FEC codewords may be embodied as Reed-Solomon forward error correction code (RS-FEC) codewords that are each indicative of 80 66-bit encoded data blocks. In some embodiments, the FEC 110 may operate on each PCS lane 112 independently, and may generate FEC codewords starting at a fixed offset from an alignment marker in the PCS lane 112 data. One potential embodiment of a method for FEC encoding that operates independently on each PCS lane 112 is described below in connection with FIG. 5. Additionally or alternatively, in some embodiments the FEC 110 may operate on encoded data assembled from all of the PCS lanes 112 together. For example, the FEC 110 may convert the data from the PCS lanes 112 back into a single logical data stream, encode the data stream using RS-FEC, and then distribute the encoded data over the PMA lanes 108 in 10-bit words. In that example, the FEC 108 may transcode a group of AMs into a bit pattern that, after distribution over the PMA lanes 108, is uniquely identifiable on each PMA lane 108. With 25 Gb/s PCS lanes 112, this technique may be extended to link speeds of 25 Gb/s (one physical lane 102), 50 Gb/s (two physical lanes 102), and 400 Gb/s (16 physical lanes 102). With 50 Gb/s PCS lanes 112, this technique may be extended to link speeds of 50 Gb/s (one physical lane 102), 100 Gb/s (two physical lanes 102), and terabit speeds (20 physical lanes 102). One potential embodiment of a method for FEC encoding that operates on all of the PCS lanes 112 together is described below in connection with FIG. 6.

In block 316, in some embodiments the Ethernet port logic 100 may multiplex encoded data from multiple PCS lanes 112 and/or PMA lanes 108 onto a single physical communication lane 102. For example, the Ethernet port logic 100 may multiplex four PCS lanes 112 operating at 25 Gb/s each onto a single physical communication lane 102 operating at 100 Gb/s, two PCS lanes 112 operating at 25

Gb/s each onto a single physical communication lane 102 operating at 50 Gb/s, or any other appropriate mux ratio.

In block 318, the Ethernet port logic 100 transmits the encoded data to a receiver via the physical communication lanes 102. The Ethernet port logic 100 may transmit the encoded data in any format appropriate for the physical medium of the communication lane 102, such as a voltage differential, current differential, voltage value, current value, light pulse, or other signal transmitted on the communication lane 102. After transmitting the encoded data, the method 300 loops back to block 302 to continue transmitting data.

Figure 5:
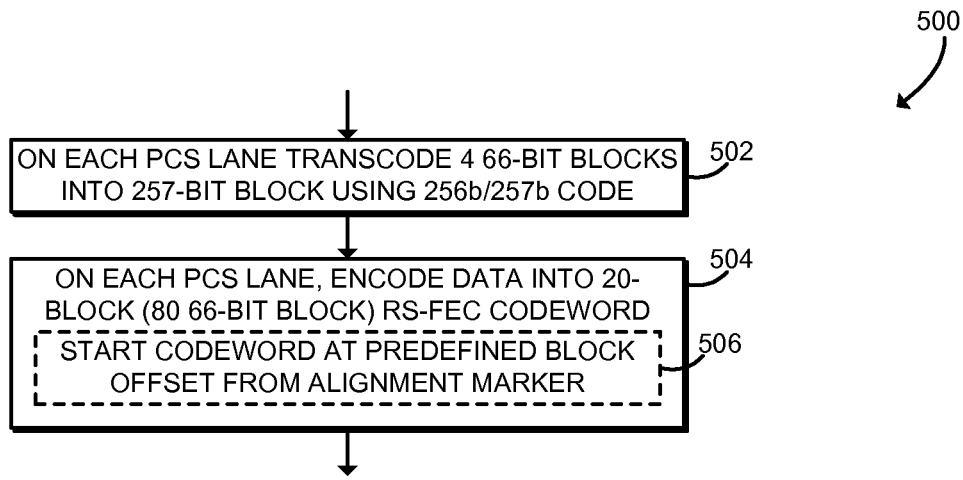
FIG. 5 is a simplified flow diagram of at least one embodiment of a method for forward error correction encoding that may be executed by the Ethernet port logic of FIG. 1.

Referring now to FIG. 5, in use, the Ethernet port logic 100 may execute a method 500 for FEC encoding data independently on each PCS lane 112. The method 500 begins in block 502, in which the FEC 110, for each PCS lane 112, transcodes four 66-bit blocks of encoded data into a single 257-bit data block using a 256 b/257 b code. In some embodiments, the FEC 110 may perform the transcoding operation described in clause 91 of the IEEE standard 802.3bj-2014.

As part of the transcoding process, the FEC 110 may transcode one or more alignment markers (AMs) or rapid alignment markers (RAMs) inserted by the PCS 114 as described above in connection with block 312 of FIG. 3. When generating the transcoded block, the FEC 110 may remove the second nibble of the block type field of the original AM and/or RAM. The AM encoding described in clause 82 of the IEEE standard 802.3 may be incompatible with the transcoding operation specified in clause 91 of the IEEE standard 802.3bj-2014, because the transcoding operation requires that the first byte in any control block be one of a few predefined values, so that the first byte may be recovered from only four bits during back-transcoding. The alignment markers described in clause 82 do not meet this requirement, and most of those AMs may collide with existing block types after transcoding forward and back. Therefore, as described above, the PCS 114 may insert alignment markers having a unique block type field. For example, in the illustrative embodiment, the FEC 110 may remove the second "0x3" nibble of the block type field "0x33." Because the AMs and RAMs use a unique block type identifier, the receiver may still identify the AM or RAM within the transcoded block.

In block 504, for each PCS lane 112, the FEC 110 encodes the encoded data blocks into RS-FEC codewords. The FEC 110 may perform an RS-FEC operation similar to that described in clause 91 of the IEEE standard 802.3bj-2014. In an illustrative embodiment, each RS-FEC codeword may include 5280 bits. Each RS-FEC codeword includes 20 257-bit transcoded data blocks, corresponding to 80 66-bit data blocks, and adds a 140-bit parity signature. In some embodiments, each RS-FEC codeword may include a different number of bits (e.g., 5440 bits includes 20 257-bit transcoded data blocks and a 300-bit parity signature). In some embodiments, in block 506, the FEC 110 begins each FEC codeword at a known offset relative to an alignment marker. For example, the first block in the first codeword may include an alignment marker. As described above in block 312 of FIG. 3, an alignment marker appears on each PCS lane 112 every 16,384 66-bit blocks. Since the greatest common divisor of 80 and 16384 is 16, when starting at a fixed offset, alignment markers will appear within a FEC codeword at 80/16=5 possible locations. As further described below in connection with FIG. 8, this alignment may allow for fast synchronization on codeword boundaries once an alignment marker is identified. As described above in connection with the FIG. 3, the encoded FEC codewords are provided to the PMD/PMA 106 for transmission to the remote link partner.

Table 2, below, illustrates how the RS-FEC codewords may be aligned with the alignment markers. As shown, an alignment marker (AM) is inserted every 16384 66-bit blocks (illustrated as having a zero offset from the AM). In the illustrative embodiment, the 80-block FEC codeword is aligned to start at the alignment marker (at offset zero). Thus, as shown, in the illustrative example an alignment marker may only appear at blocks offset 0, 64, 48, 32, or 16 from the start of the FEC codeword (i.e., five potential locations in the FEC codeword).

TABLE 2

Illustrative alignment marker offsets within FEC codeword.

| Transcoded Block Serial No. | Offset from AM | | | | Offset from beginning of codeword | | | |
|---|---|---|---|---|---|---|---|---|
| | Block 1 | Block 2 | Block 3 | Block 4 | Block 1 | Block 2 | Block 3 | Block 4 |
| 0 | 0 | 1 | 2 | 3 | 0 | 1 | 2 | 3 |
| 1 | 4 | 5 | 6 | 7 | 4 | 5 | 6 | 7 |
| 2 | 8 | 9 | 10 | 11 | 8 | 9 | 10 | 11 |
| 3 | 12 | 13 | 14 | 15 | 12 | 13 | 14 | 15 |
| ... | | | | | | | | |
| 19 | 76 | 77 | 78 | 79 | 76 | 77 | 78 | 79 |
| 20 | 80 | 81 | 82 | 83 | 0 | 1 | 2 | 3 |
| 21 | 84 | 85 | 86 | 87 | 4 | 5 | 6 | 7 |
| ... | | | | | | | | |
| 4095 | 16380 | 16381 | 16382 | 16383 | 60 | 61 | 62 | 63 |
| 4096 | 0 | 1 | 2 | 3 | 64 | 65 | 66 | 67 |
| 4097 | 4 | 5 | 6 | 7 | 68 | 69 | 70 | 71 |
| ... | | | | | | | | |
| 8192 | 0 | 1 | 2 | 3 | 48 | 49 | 50 | 51 |
| 8193 | 4 | 5 | 6 | 7 | 52 | 53 | 54 | 55 |
| ... | | | | | | | | |
| 12288 | 0 | 1 | 2 | 3 | 32 | 33 | 34 | 35 |
| 12289 | 4 | 5 | 6 | 7 | 36 | 37 | 38 | 39 |
| ... | | | | | | | | |

TABLE 2-continued

Illustrative alignment marker offsets within FEC codeword.

| Transcoded Block | Offset from AM | | | | Offset from beginning of codeword | | | |
|---|---|---|---|---|---|---|---|---|
| Serial No. | Block 1 | Block 2 | Block 3 | Block 4 | Block 1 | Block 2 | Block 3 | Block 4 |
| 16384 | 0 | 1 | 2 | 3 | 16 | 17 | 18 | 19 |
| 16385 | 4 | 5 | 6 | 7 | 20 | 21 | 22 | 23 |
| ... | | | | | | | | |
| 20480 | 0 | 1 | 2 | 3 | 0 | 1 | 2 | 3 |
| 20481 | 4 | 5 | 6 | 7 | 4 | 5 | 6 | 7 |

A similar method may be used with multiple PCS lanes 112 (by requiring the codeword to align with the alignment marker of the one of the PCS lanes 112), if the FEC 110 operates separately on each PCS lane 112. This method may also be used with FEC codes of different block sizes (e.g. clause 74 of the IEEE 802.3 standard FEC or a FEC that may be defined in the future). The number of possible locations of alignment markers in a FEC codeword may be calculated according to the greatest common divisor of the number of blocks in the FEC codeword and the distance between alignment markers.

Figure 6:
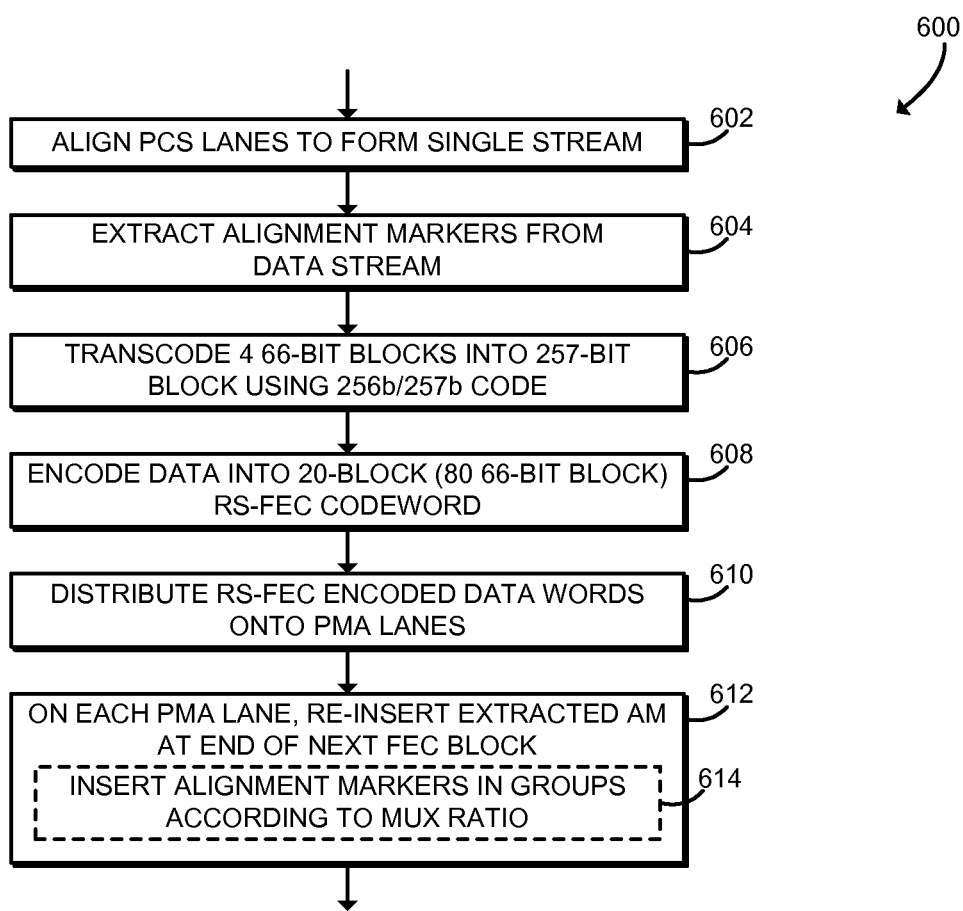
FIG. 6 is a simplified flow diagram of at least one embodiment of another method for forward error correction encoding that may be executed by the Ethernet port logic of FIG. 1.

Referring now to FIG. 6, in use, the Ethernet port logic 100 may execute a method 600 for FEC encoding data from all of the PCS lanes 112 collectively. The method 600 begins in block 602, in which the FEC 110 aligns data received on all of the PCS lanes 112 and generates a single stream of 66-bit data blocks. The FEC 110 may also perform any other operation required to produce the data stream, such as deskewing or reordering the PCS lanes 112. In block 604, the FEC 110 extracts the alignment markers from the data stream. The FEC 110 may record or otherwise determine the original position of the alignment markers in the data stream. As described above, the alignment markers may be inserted every 16,384 66-bit data blocks in each PCS lane 112. Thus, each alignment marker may be extracted at a known location in the data stream, exactly $2^{14}$=16384 66-bit blocks after the previous alignment marker.

In block 606, the FEC 110 transcodes four 66-bit blocks of encoded data into a single 257-bit data block using a 256 b/257 b code. The FEC 110 may perform the transcoding operation described in clause 91 of the IEEE 802.3bj-2014 standard. Because the alignment markers have been extracted from the data stream, the alignment markers are not transcoded. Thus, in some embodiments, the PCS 114 may use the alignment markers and/or the rapid alignment markers described by clause 82 of the IEEE standard 802.3.

In block 608, the FEC 110 encodes the encoded data blocks into 5280-bit RS-FEC codewords. The FEC 110 may perform an RS-FEC operation similar to that described in clause 91 of the IEEE standard 802.3bj-2014. Each RS-FEC codeword includes 20 257-bit transcoded data blocks, corresponding to 80 66-bit data blocks, and adds a 140-bit parity signature. In block 610, the FEC 110 distributes the RS-FEC codewords onto the PMA lanes 108. The FEC 110 may distribute the RS-FEC codewords similarly to as described in the IEEE standard 802.3bj-2014. The FEC 110 may, for example, distribute 10-bit words onto each of the PMA lanes 108 in a round-robin fashion. Thus, in those embodiments each RS-FEC codeword may be effectively striped across multiple lanes, which may reduce latency.

In block 612, the FEC 110 re-inserts the extracted alignment markers on each of the PMA lanes 108 at the end of the next RS-FEC codeword. That is, the FEC 110 may insert an alignment marker on each PMA lane 108 after the RS-FEC codeword that includes the original location of the alignment marker is transmitted on that PMA lane 108. The end of the RS-FEC codeword—and thus the position of the re-inserted alignment marker—is aligned over all of the PMA lanes 108. Thus, the re-inserted alignment markers may not be striped across all of the PMA lanes 108. Insertion of the alignment markers may cause a change of the FEC code alignment, since the RS-FEC codeword is not an integer multiple of the alignment marker length, but no bits are lost during the operation and the receiver may identify the alignment marker and re-align. As described further below in connection with FIG. 9, the receiver FEC 110 may extract the alignment marker from the incoming data and re-insert it at the specified location after FEC decoding and back-transcoding. If the number of PCS lanes 112 and PMA lanes 108 is equal (e.g. 25 Gb/s per lane without multiplexing), the FEC 110 may re-insert the full alignment marker. In some embodiments, in block 614, the FEC 110 may re-insert alignment markers from the PCS lanes 112 in groups on to the PMA lanes 108 according to the mux ratio between the PCS lanes 112 and the PMA lanes 108. For example, if the number of PMA lanes 108 is lower than the number of PCS lanes 112 (e.g. 25 Gb/s per PCS lane 112 and 50 Gb/s per PMA lane 108 by multiplexing lanes 2:1), the alignment markers may be inserted back into the data stream in groups corresponding to the mux ratio (e.g. pairs in the case above). As further described below in connection with FIG. 9, the receiver FEC 110 may reverse this process.

Figure 7:
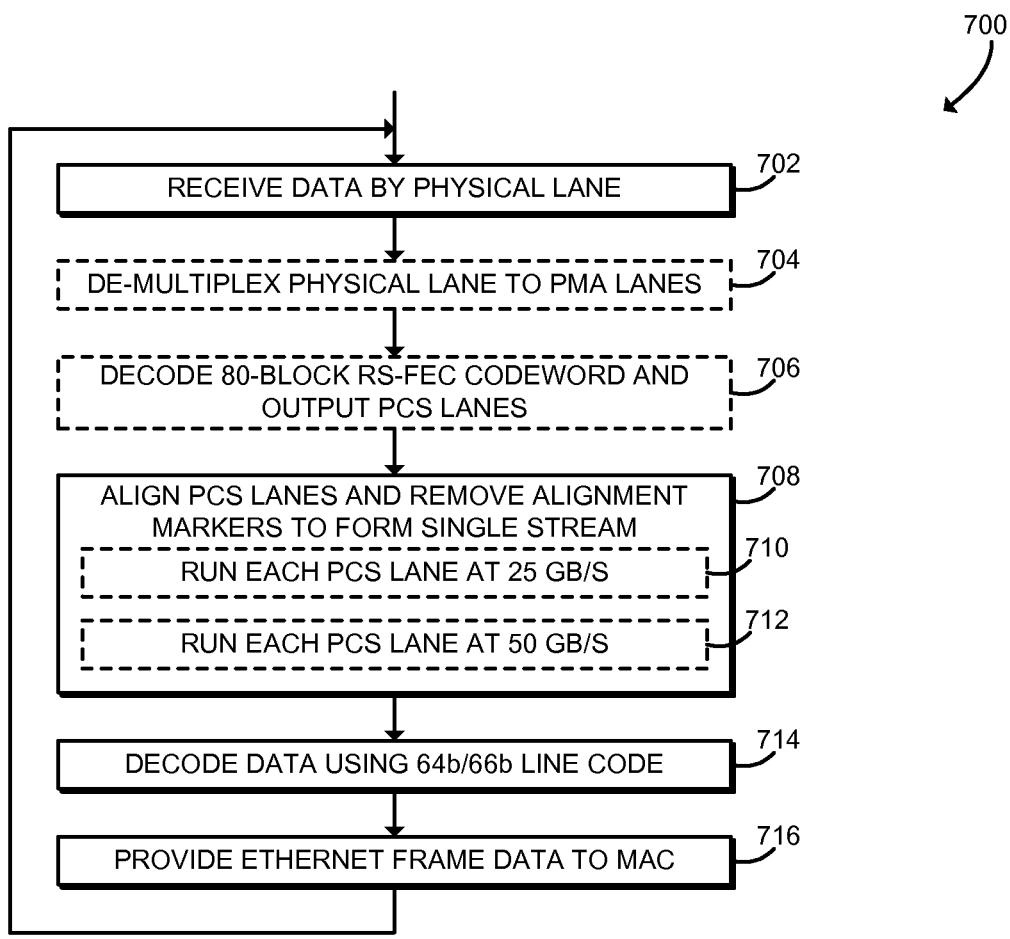
FIG. 7 is a simplified flow diagram of at least one embodiment of a method for receiving data that may be executed by the Ethernet port logic of FIG. 1.

Referring now to FIG. 7, in use, the Ethernet port logic 100 may execute a method 700 for data reception. The method 700 begins in block 702, in which the Ethernet port logic 100 receives encoded data via the physical communication lanes 102. The Ethernet port logic 100 may receive the encoded data in any format appropriate for the physical medium of each communication lane 102, such as a voltage differential, current differential, voltage value, current value, light pulse, or other signal received on the communication lane 102.

In block 704, in some embodiments, the Ethernet port logic 100 may de-multiplex encoded data from each physical communication lane 102 onto multiple PMA lanes 108 and/or PCS lanes 112. For example, the Ethernet port logic 100 may de-multiplex a single physical communication lane 102 operating at 100 Gb/s onto four PMA lanes 108 and/or PCS lanes 112 operating at 25 Gb/s each. As another example, the Ethernet port logic 100 may de-multiplex a single physical communication lane 102 operating at 50 Gb/s onto two PMA lanes 108 and/or PCS lanes 112 operating at 25 Gb/s each. Of course, in some embodiments, the Ethernet port logic 100 may not de-multiplex the encoded data, or may de-multiplex the encoded data using any other appropriate mux ratio.

In block 706, in some embodiments, the Ethernet port logic 100, using the FEC 110, may decode FEC codewords from the PMA lanes 108 into 66-bit encoded data blocks and output the encoded data blocks onto the PCS lanes 112. The FEC codewords may be embodied as Reed-Solomon forward error correction code (RS-FEC) codewords that are each indicative of 80 66-bit encoded data blocks. In some embodiments, the FEC 110 may operate on each PMA lane 108 independently, and may decode FEC codewords starting at a fixed offset from an alignment marker identified in the PMA lane 108 data. One potential embodiment of a method for FEC decoding that operates independently on each PMA lane 108 is described below in connection with FIG. 8. Additionally or alternatively, in some embodiments the FEC 110 may operate on encoded data assembled from all of the PMA lanes 108 together. One potential embodiment of a method for FEC decoding that operates on all of the PMA lanes 108 together is described below in connection with FIG. 9.

In block 708, the Ethernet port logic 100 aligns the PCS lanes 112 and removes alignment markers to form a single data stream using the PCS 114. The Ethernet port logic 100 may also perform any other operation required to reproduce the data stream, such as deskewing or reordering the PCS lanes 112. Of course, in embodiments having a single PCS lane 112, no reordering or deskewing may be required. In some embodiments, in block 710, the Ethernet port logic 100 may operate each PCS lane 112 at 25 GB/s. At 25 Gb/s per PCS lane 112, the Ethernet port logic 100 may include up to 20 distinct PCS lanes 112 (providing up to 500 Gb/s total bandwidth) and may also support 25 Gb/s Ethernet (using a single PCS lane 112) or 400 Gb/s Ethernet (using 16 PCS lanes 112, optionally multiplexed to eight or four physical communication lanes 102). In some embodiments, in block 712, the Ethernet port logic 100 may operate each PCS lane 112 at 50 GB/s. At 50 Gb/s per PCS lane 112 or faster, the Ethernet port logic 100 may support 50 Gb/s Ethernet or terabit Ethernet and beyond without requiring a new alignment marker definition.

In block 714, the Ethernet port logic 100 decodes the encoded data block using the PCS 114. As described above, the data blocks may be encoded to improve transmission efficiency over the physical communication lanes 102. The PCS 114 applies a 64 b/66 b line code to generate a 64-bit block of decoded data for each 66-bit encoded data block. In some embodiments, the PCS 114 may apply the 64 b/66 b line code described in clause 49 of the IEEE 802.3 specification; that is, the 64 b/66 b line code used by 10 GBASE-R. The decoded data may represent Ethernet frame data that may be processed by the MAC 118.

In block 716, the Ethernet port logic 100 provides the decoded data from the PCS 114 to the MAC 118. The PCS 114 may transmit the data to the MAC 118 via the media independent interface 116. The MAC 118 may receive data at the Ethernet data rate (for example, 400 Gb/s, 500 Gb/s, or 25 Gb/s). After receiving the data from the PCS 114, the MAC 118 may perform Ethernet frame detection and validation, packet reception and transmission, cyclic redundancy check (CRC) validation, CRC computation, and other media access control sublayer operations. After transmitting the decoded data to the MAC 118, the method 700 loops back to block 702 to continue receiving data.

Figure 8:
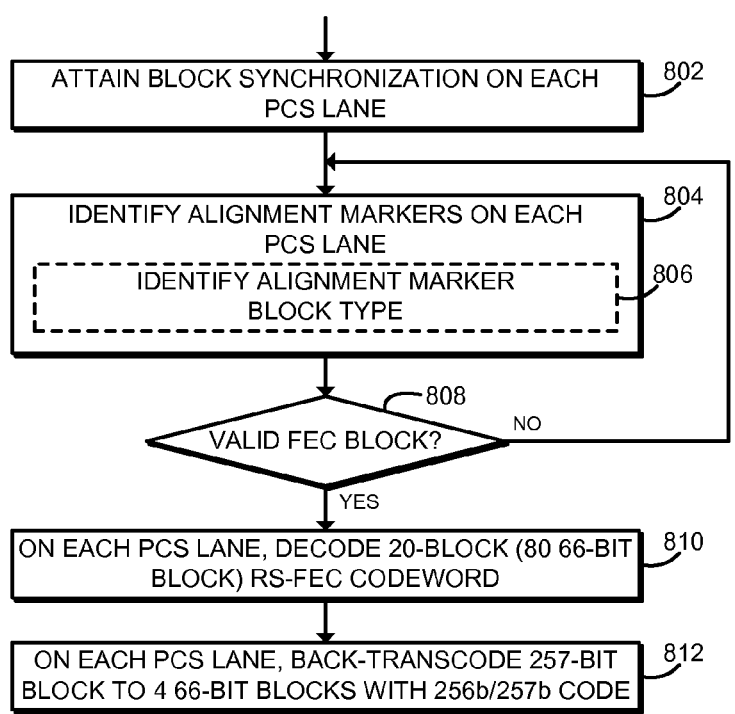
FIG. 8 is a simplified flow diagram of at least one embodiment of a method for forward error correction decoding that may be executed by the Ethernet port logic of FIG. 1.

Referring now to FIG. 8, in use, the Ethernet port logic 100 may execute a method 800 for FEC decoding data independently on each PCS lane 112. The method 800 begins in block 802, in which the FEC 110 attains block synchronization on each PCS lane 112 (which are each equivalent to a PMA lane 108). After attaining block synchronization, the Ethernet port logic 100 may identify the boundaries between 257-bit blocks of transcoded data. The Ethernet port logic 100 may identify the 257-bit blocks, for example, by identifying the five-bit headers included in each transcoded block. The FEC 110 may operate each of the PCS lanes 112 at a data rate higher than the PCS described in clause 82 of the IEEE standard 802.3. For example, in some embodiments the FEC 110 may operate each PCS lane 112 at 25 Gb/s. Additionally or alternatively, in some embodiments each PCS lane 112 may operate at 50 Gb/s or higher. As described above, it should be understood that the signaling rate of each communication lane 102 may be an integer multiple of the PCS lane 112 bit rate.

In block 804, the FEC 110 identifies an alignment marker (AM) in the incoming data stream for each PCS lane 112. As described above, AMs may be inserted by the transmitter every $2^{14}$, or 16384, 66-bit blocks in each PCS lane 112. Each AM may be embodied as a predefined 66-bit block of data as described above in connection with block 312 of FIG. 3. The AMs may be transcoded and included in the 257-bit transcoded blocks produced by the transmitter and thus also included in the FEC codewords produced by the transmitter. In some embodiments, in block 806, the FEC 110 may identify the AM by identifying the unique block type field for alignment markers within the transcoded block. For example, the FEC 110 may identify an octet representing the alignment marker block type (e.g., 0x33) or may identify the first nibble of the alignment marker block type (e.g. 0x3).

In block 808, the Ethernet port logic 100 determines whether the current AM identified in the incoming data stream is located at the beginning of a valid 5280-bit RS-FEC codeword (corresponding to 80 66-bit encoded blocks). If not, the method 800 loops back to block 804 to identify the next alignment marker. If the current AM is the beginning of a valid RS-FEC codeword, the method 800 advances to block 810.

As described above in connection with block 506 of FIG. 5, because each RS-FEC codeword may be aligned at a predefined offset with respect to the alignment markers, those alignment markers may only occur at five possible offsets from the start of a valid RS-FEC codeword. For example, the first block in the first codeword may be an alignment marker. Thus, in the illustrative embodiment the Ethernet port logic 100 may identify at most five alignment markers prior to identifying the beginning of a valid RS-FEC codeword. It should be understood that in the illustrative embodiment, the Ethernet port logic 100 may determine whether a valid RS-FEC codeword begins at any predefined offset from an alignment marker, and the Ethernet port logic 100 may identify at most five alignment markers prior to identifying the valid RS-FEC codeword. In other embodiments, the number of potential positions for alignment markers may be determined by dividing the length of the FEC codeword by the greatest common divisor of the length of the codeword and the number of blocks between alignment markers (e.g., the GCD of 80 and 16,384 is 16, and 80/16=5 possible locations). As described above, if the interval between alignment markers is changed to be a multiple of five (e.g., $5 \cdot 2^{12th}$), each alignment marker may be aligned with only one offset from the start of a valid RS-FEC codeword (i.e., the GCD of 80 and $5 \cdot 2^{12th}$ is 80). Thus, the Ethernet port logic 100 may provide fast codeword alignment.

In block 810, for each PCS lane 112, the FEC 110 decodes the 5280-bit RS-FEC codewords into 257-bit transcoded blocks. The FEC 110 may perform an RS-FEC operation similar to that described in clause 91 of the IEEE standard 802.3bj-2014. Each RS-FEC codeword is decoded into 20 257-bit transcoded data blocks, corresponding to 80 66-bit data blocks. Each RS-FEC codeword also includes a 140-bit parity signature. The FEC 110 may use the parity signature to check for and potentially correct certain data transmission errors. In some embodiments, the FEC 110 may signal transmission errors to the PCS 114 by intentionally inserting errors into the synchronization headers of the 66-bit decoded blocks.

In block 812, the FEC 110, for each PCS lane 112, back-transcodes each 257-bit transcoded blocks into a group of four 66-bit blocks of encoded data using a 256 b/257 b code. In some embodiments, the FEC 110 may perform the transcoding operation described in clause 91 of the IEEE standard 802.3bj-2014. As part of the back-transcoding process, the alignment markers included in the transcoded blocks are decoded and output on the PCS lane 112. As described above in connection with FIG. 7, the encoded data blocks are decoded by the PCS 114.

Figure 9:
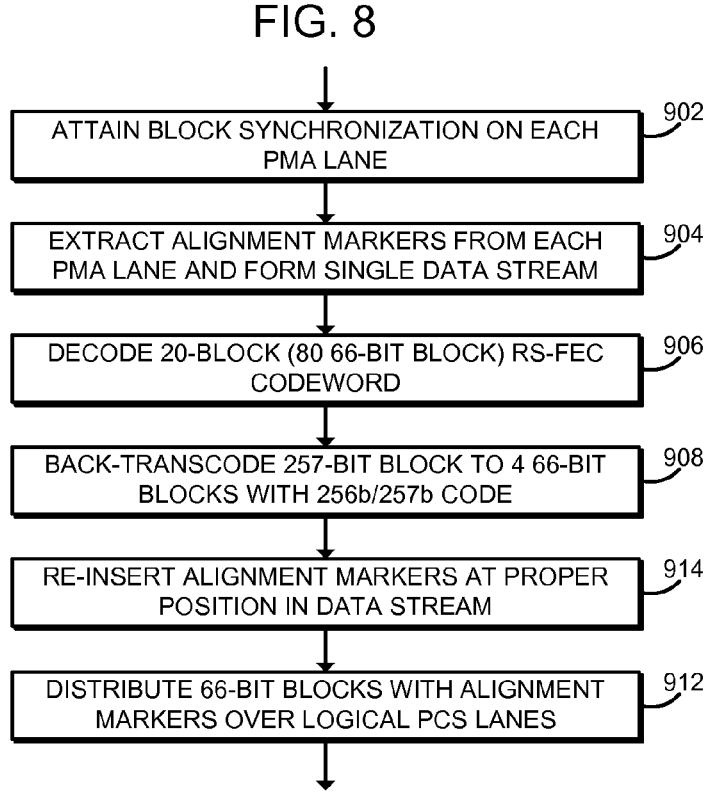
FIG. 9 is a simplified flow diagram of at least one embodiment of another method for forward error correction decoding that may be executed by the Ethernet port logic of FIG. 1.

Referring now to FIG. 9, in use, the Ethernet port logic 100 may execute a method 900 for FEC decoding data from all of the PCS lanes 112 collectively. The method 900 begins in block 902, in which the FEC 110 attains block synchronization on each PMA lane 108. After attaining block synchronization, the Ethernet port logic 100 may identify the boundaries between 257-bit blocks of transcoded data. The Ethernet port logic 100 may identify the 257-bit blocks, for example, by identifying the five-bit headers included in each transcoded block. The FEC 110 may operate each of the PCS lanes 112 at a data rate higher than the PCS described in clause 82 of the IEEE standard 802.3. For example, in some embodiments the FEC 110 may operate each PCS lane 112 at 25 Gb/s. Additionally or alternatively, in some embodiments each PCS lane 112 may operate at 50 Gb/s or higher. As described above, it should be understood that the signaling rate of each communication lane 102 may be an integer multiple of the PCS lane 112 bit rate.

In block 904, the FEC 110 extracts alignment markers from each of the PMA lanes 108 and forms a single data stream. The Ethernet port logic 100 may also perform any other operation required to reproduce the data stream, such as deskewing or reordering the PMA lanes 108. The FEC 110 may record or otherwise determine the original position of the alignment markers in the data stream. For example, as described above in connection with block 612 of FIG. 6, the transmitter may have re-inserted each the alignment marker at the end of the RS-FEC block that originally included the alignment marker.

In block 906, the FEC 110 decodes the 5280-bit RS-FEC codewords from the combined data stream into 257-bit transcoded blocks. The FEC 110 may perform an RS-FEC operation similar to that described in clause 91 of the IEEE standard 802.3bj-2014. Each RS-FEC codeword is decoded into 20 257-bit transcoded data blocks, corresponding to 80 66-bit data blocks. Each RS-FEC codeword also includes a 140-bit parity signature. The FEC 110 may use the parity signature to check for and potentially correct certain data transmission errors. In some embodiments, the FEC 110 may signal transmission errors to the PCS 114 by intentionally inserting errors into the synchronization headers of the 66-bit decoded blocks.

In block 908, the FEC 110 back-transcodes each 257-bit transcoded blocks into a group of four 66-bit blocks of encoded data using a 256 b/257 b code. In some embodiments, the FEC 110 may perform the transcoding operation described in clause 91 of the IEEE standard 802.3bj-2014. Because the alignment markers were previously extracted from the PMA lanes 108, the alignment markers are not included in the transcoded blocks and thus are not produced during the back-transcoding process.

In block 910, the FEC 110 re-inserts the extracted alignment markers at the original position in the data stream. That is, the FEC 110 may re-insert the extracted alignment marker at a location that was encoded within the previous FEC codeword. The FEC 110 may insert an alignment marker for each PCS lane 112 every 16,384 data blocks in the output data stream.

In block 912, the FEC 110 distributes the encoded 66-bit blocks from the data stream onto one or more logical PCS lanes 112. The FEC 110 may distribute the encoded blocks in a round-robin order. Each of the alignment markers, after being reinserted into the data stream, is thus distributed onto the corresponding PCS lane 112. As described above, the FEC 110 may operate each of the PCS lanes 112 at a data rate faster than the PCS lanes described in clause 82 of the IEEE standard 802.3, that is, faster than 10 Gb/s or 5 Gb/s. For example, the FEC 110 may operate each of the PCS lanes 112 at 25 Gb/s, 50 Gb/s, or faster. As described above in connection with FIG. 7, after being distributed to the PCS lanes 112, the encoded data blocks are decoded by the PCS 114.

EXAMPLES

Illustrative examples of the technologies disclosed herein are provided below. An embodiment of the technologies may include any one or more, and any combination of, the examples described below.

Example 1 includes a network interface circuit for high-speed data transmission, the network interface circuit comprising network port logic including a physical coding sublayer (PCS) logic to (i) encode first data to be transmitted into first encoded data blocks using a 66 b/64 b line code; and (ii) insert an alignment marker block into the first encoded data blocks after every first integer number of encoded data blocks to generate first aligned data blocks at a first PCS lane speed.

Example 2 includes the subject matter of Example 1, and wherein the first PCS lane speed comprises 25 gigabits per second.

Example 3 includes the subject matter of any of Examples 1 and 2, and wherein the first PCS lane speed comprises 50 gigabits per second.

Example 4 includes the subject matter of any of Examples 1-3, and wherein the PCS logic is further to distribute the first encoded data blocks onto a plurality of PCS lanes of the PCS logic, wherein each PCS lane operates at the PCS lane speed; and to insert the alignment marker block comprises to insert, for each PCS lane, an alignment marker block into the first encoded data blocks after every first integer number of encoded data blocks distributed on the corresponding PCS lane to generate the first aligned data blocks for the corresponding PCS lane.

Example 5 includes the subject matter of any of Examples 1-4, and wherein the plurality of PCS lanes comprises sixteen PCS lanes; and the PCS lane speed comprises 25 gigabits per second.

Example 6 includes the subject matter of any of Examples 1-5, and wherein the plurality of PCS lanes comprises eight PCS lanes; and the PCS lane speed comprises 50 gigabits per second.

Example 7 includes the subject matter of any of Examples 1-6, and wherein the network port logic further comprises a forward error correction (FEC) logic to encode the first aligned data blocks into first FEC codewords.

Example 8 includes the subject matter of any of Examples 1-7, and wherein to encode the first aligned data blocks into the first FEC codewords comprises to encode the first aligned data blocks using a Reed-Solomon forward error correction (RS-FEC) code.

Example 9 includes the subject matter of any of Examples 1-8, and wherein to encode the first aligned data blocks into first FEC codewords comprises to encode the first aligned data blocks into first FEC codewords that each start at a predefined offset from an alignment marker block of the first aligned data blocks, wherein each of the first FEC codewords includes a second number of aligned data blocks and wherein the first integer number of encoded data blocks plus one and the second number of aligned data blocks have a greatest common divisor greater than one.

Example 10 includes the subject matter of any of Examples 1-9, and wherein to encode the first aligned data blocks further comprises to transcode the first aligned data blocks to generate first transcoded data blocks using a 257 b/256 b transcoding algorithm; and encode the first transcoded data blocks into the first FEC codewords that each start at the predefined offset from an alignment marker block of the first transcoded data blocks.

Example 11 includes the subject matter of any of Examples 1-10, and wherein the alignment marker block comprises a data block with predetermined content.

Example 12 includes the subject matter of any of Examples 1-11, and wherein the alignment marker block comprises a control block with a predetermined unique block type field.

Example 13 includes the subject matter of any of Examples 1-12, and wherein the unique block type field comprises a binary value corresponding to hexadecimal 0x33.

Example 14 includes the subject matter of any of Examples 1-13, and wherein the first integer number of encoded data blocks comprises 16,383 encoded data blocks, and the second number of aligned data blocks comprises 80 aligned data blocks.

Example 15 includes the subject matter of any of Examples 1-14, and wherein the first integer number of encoded data blocks comprises 20,479 encoded data blocks, and the second number of aligned data blocks comprises 80 aligned data blocks.

Example 16 includes the subject matter of any of Examples 1-15, and wherein the PCS logic is further to distribute the first encoded data blocks onto a plurality of PCS lanes of the PCS logic, wherein each PCS lane operates at the PCS lane speed; to insert the alignment marker block comprises to insert, for each PCS lane, a corresponding alignment marker block into the first encoded data blocks after every first integer number of encoded data blocks distributed on the corresponding PCS lane to generate the first aligned data blocks for the corresponding PCS lane; and to encode the first aligned data blocks into first FEC codewords that each start at the predefined offset from an alignment marker block of the first aligned data blocks comprises to encode, for each PCS lane, the first aligned data blocks for the corresponding PCS lane into first FEC codewords that each start at the predefined offset from an alignment marker block of the first aligned data blocks for the corresponding PCS lane.

Example 17 includes the subject matter of any of Examples 1-16, and wherein the PCS logic is further to distribute the first encoded data blocks onto a plurality of PCS lanes of the PCS logic, wherein each PCS lane operates at the PCS lane speed; the FEC logic is further to stripe the first FEC codewords onto a plurality of PMA lanes; and to insert the alignment marker block comprises to insert, for each PCS lane, an alignment marker block into the first encoded data blocks after every first integer number of encoded data blocks distributed on the corresponding PCS lane to generate the first aligned data blocks for the corresponding PCS lane.

Example 18 includes the subject matter of any of Examples 1-17, and wherein to encode the first aligned data blocks into the first FEC codewords comprises to align the PCS lanes to generate an encoded data stream that includes the aligned data blocks; extract, for each of the PCS lanes, the corresponding alignment marker block from the encoded data stream at a corresponding original position in the encoded data stream; transcode, after extraction of the alignment marker blocks, the encoded data stream to generate first transcoded data blocks using a 257 b/256 b transcoding algorithm; encode the first transcoded data blocks into the first FEC codewords; and re-insert, for each of the PCS lanes, the corresponding alignment marker block into a corresponding PMA lane after an end of a first FEC codeword in response to striping of the first FEC codewords onto the plurality of PMA lanes, wherein the first FEC codeword includes the corresponding original position in the encoded data stream.

Example 19 includes a network interface circuit for high-speed data reception, the network interface circuit comprising network port logic including forward error correction (FEC) logic to identify a first alignment marker within a first stream of data received by the network port logic; determine whether a valid forward error correction (FEC) codeword begins at a predefined offset from the first alignment marker; and decode the valid FEC codeword to generate first encoded data blocks at a first PCS lane speed in response to a determination that the valid FEC codeword begins at the predefined offset from the first alignment marker; and a physical coding sublayer (PCS) logic to decode the first encoded data blocks into first received data using a 66 b/64 b line code.

Example 20 includes the subject matter of Example 19, and wherein to decode the valid FEC codeword to generate the first encoded data blocks comprises to decode the valid FEC codeword using a Reed-Solomon forward error correction (RS-FEC) code.

Example 21 includes the subject matter of any of Examples 19 and 20, and wherein the first PCS lane speed comprises 25 gigabits per second.

Example 22 includes the subject matter of any of Examples 19-21, and wherein the first PCS lane speed comprises 50 gigabits per second.

Example 23 includes the subject matter of any of Examples 19-22, and wherein to identify the first alignment marker comprises to identify a control block with a predetermined unique block type field in the first stream of data.

Example 24 includes the subject matter of any of Examples 19-23, and wherein to identify the first alignment marker comprises to identify a data block with predetermined content in the first stream of data.

Example 25 includes the subject matter of any of Examples 19-24, and wherein to identify the first alignment marker comprises to identify an upper nibble of a predetermined unique block type field in the first stream of data.

Example 26 includes the subject matter of any of Examples 19-25, and wherein the network port logic is further to distribute the first stream of data onto a plurality of PCS lanes, wherein each PCS lane operates at the PCS lane speed; to identify the first alignment marker comprises to identify, for each of the PCS lanes, a first alignment marker within the first stream of data of the corresponding PCS lane; to determine whether a valid FEC codeword begins at the predefined offset from the first alignment marker comprises to determine, for each of the PCS lanes, whether a valid FEC codeword begins at the predefined offset from the first alignment marker of the corresponding PCS lane; and to decode the valid FEC codeword to generate the first encoded data blocks comprises to decode, for each PCS lane, the valid FEC codeword corresponding to the PCS lane to generate first encoded data blocks corresponding to the PCS lane.

Example 27 includes a method for high-speed data transmission, the method comprising encoding, by a physical coding sublayer (PCS) logic of a network port logic, first data to be transmitted into first encoded data blocks using a 66 b/64 b line code; and inserting, by the PCS logic of the network port logic, an alignment marker block into the first encoded data blocks after every first integer number of encoded data blocks to generate first aligned data blocks at a first PCS lane speed.

Example 28 includes the subject matter of Example 27, and wherein the first PCS lane speed comprises 25 gigabits per second.

Example 29 includes the subject matter of any of Examples 27 and 28, and wherein the first PCS lane speed comprises 50 gigabits per second.

Example 30 includes the subject matter of any of Examples 27-29, and further including distributing, by the PCS logic of the network port logic, the first encoded data blocks onto a plurality of PCS lanes of the PCS logic, wherein each PCS lane operates at the PCS lane speed; wherein inserting the alignment marker block comprises inserting, for each PCS lane, an alignment marker block into the first encoded data blocks after every first integer number of encoded data blocks distributed on the corresponding PCS lane to generate the first aligned data blocks for the corresponding PCS lane.

Example 31 includes the subject matter of any of Examples 27-30, and wherein the plurality of PCS lanes comprises sixteen PCS lanes; and the PCS lane speed comprises 25 gigabits per second.

Example 32 includes the subject matter of any of Examples 27-31, and wherein the plurality of PCS lanes comprises eight PCS lanes; and the PCS lane speed comprises 50 gigabits per second.

Example 33 includes the subject matter of any of Examples 27-32, and further including encoding, by a forward error correction (FEC) logic of the network port logic, the first aligned data blocks into first FEC codewords.

Example 34 includes the subject matter of any of Examples 27-33, and wherein encoding the first aligned data blocks into the first FEC codewords comprises encoding the first aligned data blocks using a Reed-Solomon forward error correction (RS-FEC) code.

Example 35 includes the subject matter of any of Examples 27-34, and wherein encoding the first aligned data blocks into first FEC codewords comprises encoding the first aligned data blocks into first FEC codewords that each start at a predefined offset from an alignment marker block of the first aligned data blocks, wherein each of the first FEC codewords includes a second number of aligned data blocks and wherein the first integer number of encoded data blocks plus one and the second number of aligned data blocks have a greatest common divisor greater than one.

Example 36 includes the subject matter of any of Examples 27-35, and wherein encoding the first aligned data blocks further comprises transcoding the first aligned data blocks to generate first transcoded data blocks using a 257 b/256 b transcoding algorithm; and encoding the first transcoded data blocks into the first FEC codewords that each start at the predefined offset from an alignment marker block of the first transcoded data blocks.

Example 37 includes the subject matter of any of Examples 27-36, and wherein the alignment marker block comprises a data block with predetermined content.

Example 38 includes the subject matter of any of Examples 27-37, and wherein the alignment marker block comprises a control block with a predetermined unique block type field.

Example 39 includes the subject matter of any of Examples 27-38, and wherein the unique block type field comprises a binary value corresponding to hexadecimal 0x33.

Example 40 includes the subject matter of any of Examples 27-39, and wherein the first integer number of encoded data blocks comprises 16,383 encoded data blocks, and the second number of aligned data blocks comprises 80 aligned data blocks.

Example 41 includes the subject matter of any of Examples 27-40, and wherein the first integer number of encoded data blocks comprises 20,479 encoded data blocks, and the second number of aligned data blocks comprises 80 aligned data blocks.

Example 42 includes the subject matter of any of Examples 27-41, and further including distributing, by the PCS logic of the network port logic, the first encoded data blocks onto a plurality of PCS lanes of the PCS logic, wherein each PCS lane operates at the PCS lane speed; wherein inserting the alignment marker block comprises inserting, for each PCS lane, a corresponding alignment marker block into the first encoded data blocks after every first integer number of encoded data blocks distributed on the corresponding PCS lane to generate the first aligned data blocks for the corresponding PCS lane; and wherein encoding the first aligned data blocks into first FEC codewords that each start at the predefined offset from an alignment marker block of the first aligned data blocks comprises encoding, for each PCS lane, the first aligned data blocks for the corresponding PCS lane into first FEC codewords that each start at the predefined offset from an alignment marker block of the first aligned data blocks for the corresponding PCS lane.

Example 43 includes the subject matter of any of Examples 27-42, and further including distributing, by the PCS logic of the network port logic, the first encoded data blocks onto a plurality of PCS lanes of the PCS logic, wherein each PCS lane operates at the PCS lane speed; and striping, by the FEC logic of the network port logic, the first FEC codewords onto a plurality of PMA lanes; wherein inserting the alignment marker block comprises inserting, for each PCS lane, an alignment marker block into the first encoded data blocks after every first integer number of encoded data blocks distributed on the corresponding PCS lane to generate the first aligned data blocks for the corresponding PCS lane.

Example 44 includes the subject matter of any of Examples 27-43, and wherein encoding the first aligned data blocks into the first FEC codewords comprises aligning the PCS lanes to generate an encoded data stream including the aligned data blocks; extracting, for each of the PCS lanes, the corresponding alignment marker block from the encoded data stream at a corresponding original position in the encoded data stream; transcoding, after extracting the alignment marker blocks, the encoded data stream to generate first transcoded data blocks using a 257 b/256 b transcoding algorithm; encoding the first transcoded data blocks into the first FEC codewords; and re-inserting, for each of the PCS lanes, the corresponding alignment marker block into a corresponding PMA lane after an end of a first FEC codeword in response to striping the first FEC codewords onto the plurality of PMA lanes, wherein the first FEC codeword includes the corresponding original position in the encoded data stream.

Example 45 includes a method for high-speed data reception, the method comprising identifying, by forward error correction (FEC) logic of a network port logic, a first alignment marker within a first stream of data received by the network port logic; determining, by the FEC logic of the network port logic, whether a valid forward error correction (FEC) codeword begins at a predefined offset from the first alignment marker; decoding, by the FEC logic of the network port logic, the valid FEC codeword to generate first encoded data blocks at a first PCS lane speed in response to determining the valid FEC codeword begins at the predefined offset from the first alignment marker; and decoding, by a physical coding sublayer (PCS) logic of a network port logic, the first encoded data blocks into first received data using a 66 b/64 b line code.

Example 46 includes the subject matter of Example 45, and wherein decoding the valid FEC codeword to generate the first encoded data blocks comprises decoding the valid FEC codeword using a Reed-Solomon forward error correction (RS-FEC) code.

Example 47 includes the subject matter of any of Examples 45 and 46, and wherein the first PCS lane speed comprises 25 gigabits per second.

Example 48 includes the subject matter of any of Examples 45-47, and wherein the first PCS lane speed comprises 50 gigabits per second.

Example 49 includes the subject matter of any of Examples 45-48, and wherein identifying the first alignment marker comprises identifying a control block with a predetermined unique block type field in the first stream of data.

Example 50 includes the subject matter of any of Examples 45-49, and wherein identifying the first alignment marker comprises identifying a data block with predetermined content in the first stream of data.

Example 51 includes the subject matter of any of Examples 45-50, and wherein identifying the first alignment marker comprises identifying an upper nibble of a predetermined unique block type field in the first stream of data.

Example 52 includes the subject matter of any of Examples 45-51, and further comprising distributing, by the network port logic, the first stream of data onto a plurality of PCS lanes, wherein each PCS lane operates at the PCS lane speed; wherein identifying the first alignment marker comprises identifying, for each of the PCS lanes, a first alignment marker within the first stream of data of the corresponding PCS lane; determining whether a valid FEC codeword begins at the predefined offset from the first alignment marker comprises determining, for each of the PCS lanes, whether a valid FEC codeword begins at the predefined offset from the first alignment marker of the corresponding PCS lane; and decoding the valid FEC codeword to generate the first encoded data blocks comprises decoding, for each PCS lane, the valid FEC codeword corresponding to the PCS lane to generate first encoded data blocks corresponding to the PCS lane.

Example 53 includes a computing device comprising a processor; and a memory having stored therein a plurality of instructions that when executed by the processor cause the computing device to perform the method of any of Examples 27-52.

Example 54 includes one or more machine readable storage media comprising a plurality of instructions stored thereon that in response to being executed result in a computing device performing the method of any of Examples 27-52.

Example 55 includes a computing device comprising means for performing the method of any of Examples 27-52.

Example 56 includes a network port logic for high-speed data transmission, the network port logic comprising means for encoding, by a physical coding sublayer (PCS) logic of the network port logic, first data to be transmitted into first encoded data blocks using a 66 b/64 b line code; and means for inserting, by the PCS logic of the network port logic, an alignment marker block into the first encoded data blocks after every first integer number of encoded data blocks to generate first aligned data blocks at a first PCS lane speed.

Example 57 includes the subject matter of Example 56, and wherein the first PCS lane speed comprises 25 gigabits per second.

Example 58 includes the subject matter of any of Examples 56 and 57, and wherein the first PCS lane speed comprises 50 gigabits per second.

Example 59 includes the subject matter of any of Examples 56-58, and further including means for distributing, by the PCS logic of the network port logic, the first encoded data blocks onto a plurality of PCS lanes of the PCS logic, wherein each PCS lane operates at the PCS lane speed; wherein the means for inserting the alignment marker block comprises means for inserting, for each PCS lane, an alignment marker block into the first encoded data blocks after every first integer number of encoded data blocks distributed on the corresponding PCS lane to generate the first aligned data blocks for the corresponding PCS lane.

Example 60 includes the subject matter of any of Examples 56-59, and wherein the plurality of PCS lanes comprises sixteen PCS lanes; and the PCS lane speed comprises 25 gigabits per second.

Example 61 includes the subject matter of any of Examples 56-60, and wherein the plurality of PCS lanes comprises eight PCS lanes; and the PCS lane speed comprises 50 gigabits per second.

Example 62 includes the subject matter of any of Examples 56-61, and further including means for encoding, by a forward error correction (FEC) logic of the network port logic, the first aligned data blocks into first FEC codewords.

Example 63 includes the subject matter of any of Examples 56-62, and wherein the means for encoding the first aligned data blocks into the first FEC codewords comprises means for encoding the first aligned data blocks using a Reed-Solomon forward error correction (RS-FEC) code.

Example 64 includes the subject matter of any of Examples 56-63, and wherein the means for encoding the first aligned data blocks into first FEC codewords comprises means for encoding the first aligned data blocks into first FEC codewords that each start at a predefined offset from an alignment marker block of the first aligned data blocks, wherein each of the first FEC codewords includes a second number of aligned data blocks and wherein the first integer number of encoded data blocks plus one and the second number of aligned data blocks have a greatest common divisor greater than one.

Example 65 includes the subject matter of any of Examples 56-64, and wherein the means for encoding the first aligned data blocks further comprises means for transcoding the first aligned data blocks to generate first transcoded data blocks using a 257 b/256 b transcoding algorithm; and means for encoding the first transcoded data blocks into the first FEC codewords that each start at the predefined offset from an alignment marker block of the first transcoded data blocks.

Example 66 includes the subject matter of any of Examples 56-65, and wherein the alignment marker block comprises a data block with predetermined content.

Example 67 includes the subject matter of any of Examples 56-66, and wherein the alignment marker block comprises a control block with a predetermined unique block type field.

Example 68 includes the subject matter of any of Examples 56-67, and wherein the unique block type field comprises a binary value corresponding to hexadecimal 0x33.

Example 69 includes the subject matter of any of Examples 56-68, and wherein the first integer number of encoded data blocks comprises 16,383 encoded data blocks, and the second number of aligned data blocks comprises 80 aligned data blocks.

Example 70 includes the subject matter of any of Examples 56-69, and wherein the first integer number of encoded data blocks comprises 20,479 encoded data blocks, and the second number of aligned data blocks comprises 80 aligned data blocks.

Example 71 includes the subject matter of any of Examples 56-70, and further including means for distributing, by the PCS logic of the network port logic, the first encoded data blocks onto a plurality of PCS lanes of the PCS logic, wherein each PCS lane operates at the PCS lane speed; wherein the means for inserting the alignment marker block comprises means for inserting, for each PCS lane, a corresponding alignment marker block into the first encoded data blocks after every first integer number of encoded data blocks distributed on the corresponding PCS lane to generate the first aligned data blocks for the corresponding PCS lane; and wherein the means for encoding the first aligned data blocks into first FEC codewords that each start at the predefined offset from an alignment marker block of the first aligned data blocks comprises means for encoding, for each PCS lane, the first aligned data blocks for the corresponding PCS lane into first FEC codewords that each start at the predefined offset from an alignment marker block of the first aligned data blocks for the corresponding PCS lane.

Example 72 includes the subject matter of any of Examples 56-71, and further including means for distributing, by the PCS logic of the network port logic, the first encoded data blocks onto a plurality of PCS lanes of the PCS logic, wherein each PCS lane operates at the PCS lane speed; and means for striping, by the FEC logic of the network port logic, the first FEC codewords onto a plurality of PMA lanes; wherein the means for inserting the alignment marker block comprises means for inserting, for each PCS lane, an alignment marker block into the first encoded data blocks after every first integer number of encoded data blocks distributed on the corresponding PCS lane to generate the first aligned data blocks for the corresponding PCS lane.

Example 73 includes the subject matter of any of Examples 56-72, and wherein the means for encoding the first aligned data blocks into the first FEC codewords comprises means for aligning the PCS lanes to generate an encoded data stream including the aligned data blocks; means for extracting, for each of the PCS lanes, the corresponding alignment marker block from the encoded data stream at a corresponding original position in the encoded data stream; means for transcoding, after extracting the alignment marker blocks, the encoded data stream to generate first transcoded data blocks using a 257 b/256 b transcoding algorithm; means for encoding the first transcoded data blocks into the first FEC codewords; and means for re-inserting, for each of the PCS lanes, the corresponding alignment marker block into a corresponding PMA lane after an end of a first FEC codeword in response to striping the first FEC codewords onto the plurality of PMA lanes, wherein the first FEC codeword includes the corresponding original position in the encoded data stream.

Example 74 includes a network port logic for high-speed data reception, the network port logic comprising means for identifying, by forward error correction (FEC) logic of the network port logic, a first alignment marker within a first stream of data received by the network port logic; means for determining, by the FEC logic of the network port logic, whether a valid forward error correction (FEC) codeword begins at a predefined offset from the first alignment marker; means for decoding, by the FEC logic of the network port logic, the valid FEC codeword to generate first encoded data blocks at a first PCS lane speed in response to determining the valid FEC codeword begins at the predefined offset from the first alignment marker; and means for decoding, by a physical coding sublayer (PCS) logic of a network port logic, the first encoded data blocks into first received data using a 66 b/64 b line code.

Example 75 includes the subject matter of Example 74, and wherein the means for decoding the valid FEC codeword to generate the first encoded data blocks comprises means for decoding the valid FEC codeword using a Reed-Solomon forward error correction (RS-FEC) code.

Example 76 includes the subject matter of any of Examples 74 and 75, and wherein the first PCS lane speed comprises 25 gigabits per second.

Example 77 includes the subject matter of any of Examples 74-76, and wherein the first PCS lane speed comprises 50 gigabits per second.

Example 78 includes the subject matter of any of Examples 74-77, and wherein the means for identifying the first alignment marker comprises means for identifying a control block with a predetermined unique block type field in the first stream of data.

Example 79 includes the subject matter of any of Examples 74-78, and wherein the means for identifying the first alignment marker comprises means for identifying a data block with predetermined content in the first stream of data.

Example 80 includes the subject matter of any of Examples 74-79, and wherein the means for identifying the first alignment marker comprises means for identifying an upper nibble of a predetermined unique block type field in the first stream of data.

Example 81 includes the subject matter of any of Examples 74-80, and further including means for distributing the first stream of data onto a plurality of PCS lanes, wherein each PCS lane operates at the PCS lane speed; wherein the means for identifying the first alignment marker comprises means for identifying, for each of the PCS lanes, a first alignment marker within the first stream of data of the corresponding PCS lane; the means for determining whether a valid FEC codeword begins at the predefined offset from the first alignment marker comprises means for determining, for each of the PCS lanes, whether a valid FEC codeword begins at the predefined offset from the first alignment marker of the corresponding PCS lane; and the means for decoding the valid FEC codeword to generate the first encoded data blocks comprises means for decoding, for each PCS lane, the valid FEC codeword corresponding to the PCS lane to generate first encoded data blocks corresponding to the PCS lane.

The invention claimed is:

1. A network interface circuit for high-speed data transmission, the network interface circuit comprising network port logic including:
   a physical coding sublayer (PCS) logic to (i) encode first data to be transmitted into first encoded data blocks using a 66 b/64 b line code; and (ii) insert an alignment marker block into the first encoded data blocks after every first integer number of encoded data blocks to generate first aligned data blocks at a first PCS lane speed; and
   a forward error correction (FEC) logic to encode the first aligned data blocks into first FEC codewords that each start at a predefined offset from an alignment marker block of the first aligned data blocks, wherein each of the first FEC codewords includes a second number of aligned data blocks and wherein the first integer number of encoded data blocks plus one and the second number of aligned data blocks have a greatest common divisor greater than one.

2. The network interface circuit of claim 1, wherein the first PCS lane speed comprises 25 gigabits per second.

3. The network interface circuit of claim 1, wherein the first PCS lane speed comprises 50 gigabits per second.

4. The network interface circuit of claim 1, wherein to encode the first aligned data blocks further comprises to:
   transcode the first aligned data blocks to generate first transcoded data blocks using a 257 b/256 b transcoding algorithm; and
   encode the first transcoded data blocks into the first FEC codewords that each start at the predefined offset from an alignment marker block of the first transcoded data blocks.

5. The network interface circuit of claim 4, wherein the alignment marker block comprises a data block with predetermined content, wherein the unique block type field comprises a binary value corresponding to hexadecimal 0x33.

6. The network interface circuit of claim 1, wherein the first integer number of encoded data blocks comprises 20,479 encoded data blocks, and the second number of aligned data blocks comprises 80 aligned data blocks.

7. The network interface circuit of claim 1, wherein:
   the PCS logic is further to distribute the first encoded data blocks onto a plurality of PCS lanes of the PCS logic, wherein each PCS lane operates at the PCS lane speed;
   to insert the alignment marker block comprises to insert, for each PCS lane, a corresponding alignment marker block into the first encoded data blocks after every first integer number of encoded data blocks distributed on the corresponding PCS lane to generate the first aligned data blocks for the corresponding PCS lane; and
   to encode the first aligned data blocks into first FEC codewords that each start at the predefined offset from an alignment marker block of the first aligned data blocks comprises to encode, for each PCS lane, the first aligned data blocks for the corresponding PCS lane into first FEC codewords that each start at the predefined offset from an alignment marker block of the first aligned data blocks for the corresponding PCS lane.

8. A network interface circuit for high-speed data transmission, the network interface circuit comprising network port logic including:
   a physical coding sublayer (PCS) logic to (i) encode first data to be transmitted into first encoded data blocks using a 66 b/64 b line code, (ii) insert an alignment marker block into the first encoded data blocks after every first integer number of encoded data blocks to generate first aligned data blocks at a first PCS lane speed, and (iii) distribute the first encoded data blocks onto a plurality of PCS lanes of the PCS logic, wherein each PCS lane operates at the PCS lane speed; and
   a forward error correction (FEC) logic to encode the first aligned data blocks into first FEC codewords and stripe the first FEC codewords onto a plurality of PMA lanes;
   wherein to insert the alignment marker block comprises to insert, for each PCS lane, an alignment marker block into the first encoded data blocks after every first integer number of encoded data blocks distributed on the corresponding PCS lane to generate the first aligned data blocks for the corresponding PCS lane.

9. The network interface circuit of claim 8, wherein to encode the first aligned data blocks into the first FEC codewords comprises to:
   align the PCS lanes to generate an encoded data stream that includes the aligned data blocks;
   extract, for each of the PCS lanes, the corresponding alignment marker block from the encoded data stream at a corresponding original position in the encoded data stream;
   transcode, after extraction of the alignment marker blocks, the encoded data stream to generate first transcoded data blocks using a 257 b/256 b transcoding algorithm;
   encode the first transcoded data blocks into the first FEC codewords; and
   re-insert, for each of the PCS lanes, the corresponding alignment marker block into a corresponding PMA lane after an end of a first FEC codeword in response to striping of the first FEC codewords onto the plurality of PMA lanes, wherein the first FEC codeword includes the corresponding original position in the encoded data stream.

10. A method for high-speed data transmission, the method comprising:
   encoding, by a physical coding sublayer (PCS) logic of a network port logic, first data to be transmitted into first encoded data blocks using a 66 b/64 b line code;
   inserting, by the PCS logic of the network port logic, an alignment marker block into the first encoded data blocks after every first integer number of encoded data blocks to generate first aligned data blocks at a first PCS lane speed; and
   encoding, by a forward error correction (FEC) logic of the network port logic, the first aligned data blocks into first FEC codewords that each start at a predefined offset from an alignment marker block of the first aligned data blocks, wherein each of the first FEC codewords includes a second number of aligned data blocks and wherein the first integer number of encoded data blocks plus one and the second number of aligned data blocks have a greatest common divisor greater than on.

11. The method of claim 10, further comprising:
distributing, by the PCS logic of the network port logic, the first encoded data blocks onto a plurality of PCS lanes of the PCS logic, wherein each PCS lane operates at the PCS lane speed;
wherein inserting the alignment marker block comprises inserting, for each PCS lane, a corresponding alignment marker block into the first encoded data blocks after every first integer number of encoded data blocks distributed on the corresponding PCS lane to generate the first aligned data blocks for the corresponding PCS lane; and
wherein encoding the first aligned data blocks into first FEC codewords that each start at the predefined offset from an alignment marker block of the first aligned data blocks comprises encoding, for each PCS lane, the first aligned data blocks for the corresponding PCS lane into first FEC codewords that each start at the predefined offset from an alignment marker block of the first aligned data blocks for the corresponding PCS lane.

12. A method for high-speed data transmission, the method comprising:
encoding, by a physical coding sublayer (PCS) logic of a network port logic, first data to be transmitted into first encoded data blocks using a 66 b/64 b line code;
inserting, by the PCS logic of the network port logic, an alignment marker block into the first encoded data blocks after every first integer number of encoded data blocks to generate first aligned data blocks at a first PCS lane speed;
distributing, by the PCS logic of the network port logic, the first encoded data blocks onto a plurality of PCS lanes of the PCS logic, wherein each PCS lane operates at the PCS lane speed;
encoding, by a forward error correction (FEC) logic of the network port logic, the first aligned data blocks into first FEC codewords; and
striping, by the FEC logic of the network port logic, the first FEC codewords onto a plurality of PMA lanes;
wherein inserting the alignment marker block comprises inserting, for each PCS lane, an alignment marker block into the first encoded data blocks after every first integer number of encoded data blocks distributed on the corresponding PCS lane to generate the first aligned data blocks for the corresponding PCS lane.

13. The method of claim 12, wherein to encoding the first aligned data blocks into the first FEC codewords comprises to:
aligning the PCS lanes to generate an encoded data stream including the aligned data blocks;
extracting, for each of the PCS lanes, the corresponding alignment marker block from the encoded data stream at a corresponding original position in the encoded data stream;
transcoding, after extracting the alignment marker blocks, the encoded data stream to generate first transcoded data blocks using a 257 b/256 b transcoding algorithm;
encoding the first transcoded data blocks into the first FEC codewords; and
re-inserting, for each of the PCS lanes, the corresponding alignment marker block into a corresponding PMA lane after an end of a first FEC codeword in response to striping the first FEC codewords onto the plurality of PMA lanes, wherein the first FEC codeword includes the corresponding original position in the encoded data stream.

14. One or more non-transitory, computer-readable storage media comprising a plurality of instructions that in response to being executed cause a network port logic to:
encode, by a physical coding sublayer (PCS) logic of the network port logic, first data to be transmitted into first encoded data blocks using a 66 b/64 b line code;
insert, by the PCS logic of the network port logic, an alignment marker block into the first encoded data blocks after every first integer number of encoded data blocks to generate first aligned data blocks at a first PCS lane speed; and
encode, by a forward error correction (FEC) logic of the network port logic, the first aligned data blocks into first FEC codewords that each start at a predefined offset from an alignment marker block of the first aligned data blocks, wherein each of the first FEC codewords includes a second number of aligned data blocks and wherein the first integer number of encoded data blocks plus one and the second number of aligned data blocks have a greatest common divisor greater than one.

15. The one or more non-transitory, computer-readable storage media of claim 14, wherein to encode the first aligned data blocks further comprises to:
transcode the first aligned data blocks to generate first transcoded data blocks using a 257 b/256 b transcoding algorithm; and
encode the first transcoded data blocks into the first FEC codewords that each start at the predefined offset from an alignment marker block of the first transcoded data blocks.

16. The one or more non-transitory, computer-readable storage media of claim 15, wherein the alignment marker block comprises a control block with a predetermined unique block type field, wherein the unique block type field comprises a binary value corresponding to hexadecimal 0x33.

17. The one or more non-transitory, computer-readable storage media of claim 14, further comprising a plurality of instructions that in response to being executed cause the network port logic to:
distribute, by the PCS logic of the network port logic, the first encoded data blocks onto a plurality of PCS lanes of the PCS logic, wherein each PCS lane operates at the PCS lane speed;
wherein to insert the alignment marker block comprises to insert, for each PCS lane, a corresponding alignment marker block into the first encoded data blocks after every first integer number of encoded data blocks distributed on the corresponding PCS lane to generate the first aligned data blocks for the corresponding PCS lane; and
wherein to encode the first aligned data blocks into first FEC codewords that each start at the predefined offset from an alignment marker block of the first aligned data blocks comprises to encode, for each PCS lane, the first aligned data blocks for the corresponding PCS lane into first FEC codewords that each start at the predefined offset from an alignment marker block of the first aligned data blocks for the corresponding PCS lane.

18. One or more non-transitory, computer-readable storage media comprising a plurality of instructions that in response to being executed cause a network port logic to:
encode, by a physical coding sublayer (PCS) logic of the network port logic, first data to be transmitted into first encoded data blocks using a 66 b/64 b line code;

insert, by the PCS logic of the network port logic, an alignment marker block into the first encoded data blocks after every first integer number of encoded data blocks to generate first aligned data blocks at a first PCS lane speed;

distribute, by the PCS logic of the network port logic, the first encoded data blocks onto a plurality of PCS lanes of the PCS logic, wherein each PCS lane operates at the PCS lane speed;

encode, by a forward error correction (FEC) logic of the network port logic, the first aligned data blocks into first FEC codewords; and stripe, by the FEC logic of the network port logic, the first FEC codewords onto a plurality of PMA lanes;

wherein to insert the alignment marker block comprises to insert, for each PCS lane, an alignment marker block into the first encoded data blocks after every first integer number of encoded data blocks distributed on the corresponding PCS lane to generate the first aligned data blocks for the corresponding PCS lane.

19. The one or more non-transitory, computer-readable storage media of claim 18, wherein to encode the first aligned data blocks into the first FEC codewords comprises to:

align the PCS lanes to generate an encoded data stream including the aligned data blocks;

extract, for each of the PCS lanes, the corresponding alignment marker block from the encoded data stream at a corresponding original position in the encoded data stream;

transcode, after extracting the alignment marker blocks, the encoded data stream to generate first transcoded data blocks using a 257 b/256 b transcoding algorithm;

encode the first transcoded data blocks into the first FEC codewords; and re-insert, for each of the PCS lanes, the corresponding alignment marker block into a corresponding PMA lane after an end of a first FEC codeword in response to striping the first FEC codewords onto the plurality of PMA lanes, wherein the first FEC codeword includes the corresponding original position in the encoded data stream.

* * * * *